(12) United States Patent
Oda

(10) Patent No.: US 7,114,121 B2
(45) Date of Patent: Sep. 26, 2006

(54) RATE MATCHING DEVICE AND RATE MATCHING METHOD

(75) Inventor: Yasuyo Oda, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 189 days.

(21) Appl. No.: 10/478,139

(22) PCT Filed: Jan. 30, 2003

(86) PCT No.: PCT/JP03/00922

§ 371 (c)(1),
(2), (4) Date: Nov. 20, 2003

(87) PCT Pub. No.: WO03/065689

PCT Pub. Date: Aug. 7, 2003

(65) Prior Publication Data

US 2004/0158797 A1   Aug. 12, 2004

(30) Foreign Application Priority Data

Jan. 30, 2002   (JP) .............................. 2002-021499

(51) Int. Cl.
*H03M 13/03*   (2006.01)
*G06F 11/00*   (2006.01)

(52) U.S. Cl. .................................................... 714/790
(58) Field of Classification Search ................. 714/790
See application file for complete search history.

(56) References Cited

U.S. PATENT DOCUMENTS

| 6,601,214 B1* | 7/2003 | Hammons, Jr. | ............. 714/790 |
| 6,671,851 B1* | 12/2003 | Moulsley | ...................... 714/790 |
| 6,744,744 B1* | 6/2004 | Tong et al. | .................. 370/320 |
| 6,751,772 B1* | 6/2004 | Kim et al. | ................... 714/786 |
| 6,868,520 B1* | 3/2005 | Fauconnier | .................. 714/790 |
| 2002/0027956 A1 | 3/2002 | Lee et al. | .................... 375/262 |

FOREIGN PATENT DOCUMENTS

| CA | 2277239 | 1/2001 |
| JP | 2000022553 | 1/2000 |
| JP | 2001251199 | 9/2001 |
| JP | 2002051030 | 2/2002 |
| JP | 2003101473 | 4/2003 |

OTHER PUBLICATIONS

International Search Report dated May 20, 2003.
3G TS 25.212 v3.3.0, Jun. 2000, 3rd Generation Partnership Project; Technical Specification Group Radio Access Network; Multiplexing and channel coding (FDD); (Release 1999), pp. 1-62.
Chinese Office Action dated Mar. 10, 2006.

* cited by examiner

*Primary Examiner*—Shelly Chase
(74) *Attorney, Agent, or Firm*—Stevens, Davis, Miller & Mosher, LLP

(57) ABSTRACT

A data distributor distributes interleaved data strings and outputs them to puncturing sections in a frame unit. A puncturing instructing section refers to a rate matching table to output information on data to be punctured to a plurality of puncturing sections. Each puncturing section performs the judgment processing on whether puncturing is to be performed only for parity bits according to the rule of an arrangement of information bits and parity bits for each frame and then performs puncturing. This enables to reduce processing for turbo-coded data after interleave processing and to perform light-load rate matching.

10 Claims, 13 Drawing Sheets

| FIRST FRAME | SECOND FRAME | THIRD FRAME | FOURTH FRAME |
|---|---|---|---|
| X1 | Y1 | Y'1 | X2 |
| Y2 | Y'2 | X3 | Y3 |
| Y'3 | X4 | Y4 | Y'4 |
| X5 | Y5 | Y'5 | X6 |
| ⋮ | ⋮ | ⋮ | ⋮ |

FIG.2

| FIRST FRAME | SECOND FRAME |
|:---:|:---:|
| X1 | Y1 |
| Y'1 | X2 |
| Y2 | Y'2 |
| X3 | Y3 |
| Y'3 | X4 |
| Y4 | Y'4 |
| ⋮ | ⋮ |

FIG.6

| FIRST FRAME | SECOND FRAME | THIRD FRAME | FOURTH FRAME | FIFTH FRAME | SIXTH FRAME | SEVENTH FRAME | EIGHTH FRAME |
|---|---|---|---|---|---|---|---|
| X1 | Y1 | Y'1 | X2 | Y2 | Y'2 | X3 | Y3 |
| Y'3 | X4 | Y4 | Y'4 | X5 | Y5 | Y'5 | X6 |
| Y6 | Y'6 | X7 | Y7 | Y'7 | X8 | Y8 | Y'8 |
| X9 | Y9 | Y'9 | X10 | Y10 | Y'10 | X11 | Y11 |
| ...... | ...... | ...... | ...... | ...... | ...... | ...... | ...... |

FIG.7

| FIRST FRAME | SECOND FRAME |
|:---:|:---:|
| X1 | Y1 |
| Y'1 | X2 |
| Y2 |  |
| X3 | Y3 |
|  | X4 |
| Y4 | Y4' |
| ⋮ | ⋮ |

FIG.12

| FIRST FRAME | SECOND FRAME | THIRD FRAME | FOURTH FRAME | FIFTH FRAME | SIXTH FRAME | SEVENTH FRAME | EIGHTH FRAME |
|---|---|---|---|---|---|---|---|
| X1 | Y1 | Y'1 | X2 | Y2 | Y5 | X3 | Y3 |
| Y6 | X4 | Y4 | Y'4 | X5 | X8 | Y'5 | X6 |
| X9 | Y'6 | X7 | Y7 | Y'7 | Y'10 | Y8 | Y'8 |
| ...... | Y9 | ...... | X10 | Y10 | ...... | X11 | Y11 |
| | ...... | | ...... | ...... | | ...... | ...... |

FIG.13

RATE MATCHING DEVICE AND RATE MATCHING METHOD

TECHNICAL FIELD

The present invention relates to a rate matching apparatus and rate matching method, and more particularly to a rate matching apparatus and rate matching method that performs puncturing or depuncturing to a turbo code.

BACKGROUND ART

In specification TS25.212 Ver.3.3.0 disclosed in 3GPP (3rd Generation Partnership Project) that is a standard mechanism of third digital mobile communications, there are regulations on a turbo coder and a rate matching apparatus that performs puncturing. There is a regulation in which when puncturing is performed to execute rate matching, only a parity bit is deleted without deleting an information bit from a turbo-coded data string.

A feature of the turbo-coded data string is an arrangement of the information bits and the parity bits. For example, in the case of the turbo code with a coding rate of 1/3, one information bit and two parity bits are arranged in order.

When puncturing is performed by a conventional rate matching apparatus, judgment processing on whether a first information bit is to be reduced is not performed, and judgment processing on whether a next parity bit is to be reduced is performed.

However, the arrangement of the information bits and the parity bits changes since interleave processing is performed in a step prior to rate matching. Before puncturing is performed by rate matching, it is necessary to perform a computation for making a distinction between the information bit and the parity bit in the data string where the arrangement was changed by interleave processing.

While, when data is transmitted to a base station from a mobile station, in 3GPP, there is a regulation in which interleave processing is first performed to turbo-coded data and rate matching is executed thereafter. More specifically, data is arranged in a plurality of frames by interleave processing and data is punctured in an each frame by rate matching.

In this case, the arrangement of the information bits and the parity bits differs for each frame by interleave processing. For example, the information bit is placed first of data in a certain frame, but there is a case in which the information bit is placed second or third in another frame.

In this way, regarding turbo-coded data after interleave processing, since the arrangement of the information bits and the parity bits differs for each frame, puncturing cannot be performed to all frames by the same task, so that there is a need to perform a computation for making a distinction between the information bit and the parity bit in data after interleave processing.

DISCLOSURE OF INVENTION

An object of the present invention is to provide a rate matching apparatus and rate matching method that eliminates the computation for making a distinction between an information bit and a parity bit in turbo-coded data after interleave processing, thus making it possible to perform light-load rate matching.

BRIEF DESCRIPTION OF DRAWINGS

FIG. 2 is a view illustrating one example of turbo-coded data strings;

FIG. 6 is a view illustrating one example of turbo-coded data strings;

FIG. 7 is a view illustrating one example of turbo-coded data strings;

FIG. 12 is a view illustrating one example of turbo-coded data strings; and

FIG. 13 is a view illustrating one example of turbo-coded data strings.

BEST MODE FOR CARRYING OUT THE INVENTION

An outline of the present invention is that interleaved data strings are divided in a frame unit, and an arrangement of information bits is measured in each frame by the order of information bits and parity bits, and puncturing is performed to only the parity bits without the computation for making a distinction between the information bit and the parity bit.

(Embodiment 1)

Figure 1:
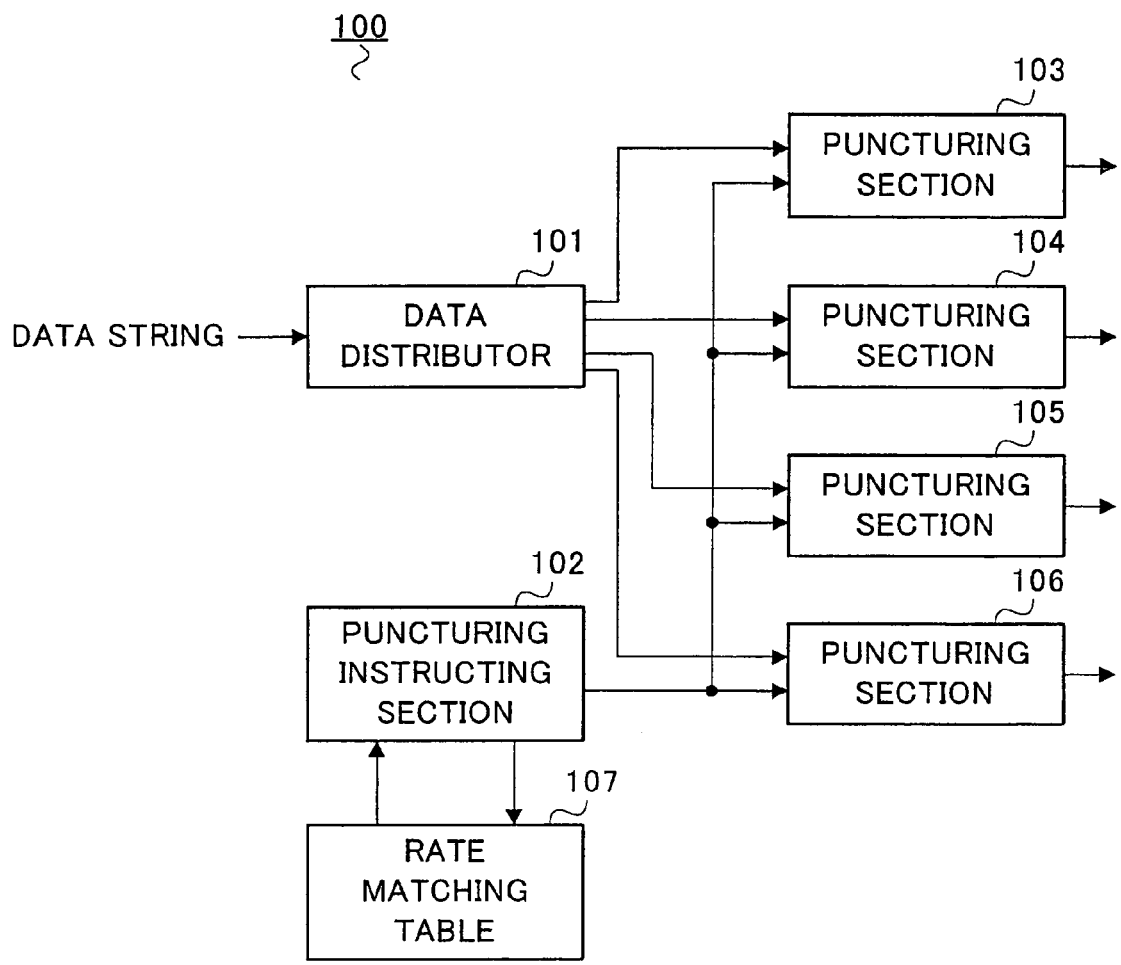
FIG. 1 is a block diagram illustrating a configuration of a rate matching apparatus according to Embodiment 1 of the present invention.

FIG. 1 is a block diagram illustrating a configuration of a rate matching apparatus according to Embodiment 1 of the present invention. This embodiment explains an example in which a TTI (Transmission Time Interval) is 40 ms and a frame length is 10 ms. The TTI is four times as large as the frame length and the transmission is performed in unit of four frames.

In the following, a frame where data is first placed is referred to a first frame, a frame where data is second placed is referred to a second frame, a frame where data is third placed is referred to a third frame, and a frame where data is fourth placed is referred to a fourth frame.

In FIG. 1, a rate matching apparatus 100 mainly includes a data distributor 101, a puncturing instructing section 102, puncturing sections 103 to 106, and a rate matching table 107.

The data distributor 101 distributes interleaved data strings in a frame unit and outputs them to the puncturing sections 103 to 106. Additionally, the details of the distributing method for the data string by the data distributor 101 will be described later.

More specifically, the data distributor 101 outputs the interleaved data for the first frame to the puncturing section 103, the interleaved data for the second frame to the puncturing section 104, the interleaved data for the third frame to the puncturing section 105, and the interleaved data for the fourth frame to the puncturing section 106.

The puncturing instructing section 102 refers to the rate matching table 107 to output rate matching parameters for the data to be punctured to the puncturing section 103, the puncturing section 104, the puncturing section 105, and the puncturing section 106.

The puncturing section 103 performs the judgment processing on whether puncturing is to be performed only for 3n+second and 3n+third data in the data string of the first frame and then performs puncturing. Here, n is an integer of 0 or more.

The puncturing section 104 performs the judgment processing on whether puncturing is to be performed only for 3n+first and 3n+third data in the data string of the second frame and then performs puncturing.

The puncturing section 105 performs the judgment processing on whether puncturing is to be performed only for 3n+first and 3n+second data in the data string of the third frame and then performs puncturing.

The puncturing section 106 performs the judgment processing on whether puncturing is to be performed only for 3n+second and 3n+third data in the data string of the fourth frame and then performs puncturing. The rate matching table 107 stores information of the data to be punctured.

FIG. 2 is a view illustrating one example of turbo-coded data strings. In FIG. 2, X indicates an information bit, and Y and Y' indicate parity bits. Moreover, subscripts of X, Y, Y' indicate the relation between the information bit and the parity bits. For example, the parity bits for information bit X1 are Y1 and Y1'.

The data string (X1, X2, X3, . . . Xn) is added two parity bits per one information bit with Turbo coder which coding rate is 1/3, thus the data string (X1, Y1, Y'1, X2, Y2, Y'2, X3, Y3, Y'3 . . . Xn, Yn, Y'n) is generated.

In the turbo-coded data string, each data is placed in a plurality of frames by interleave processing. More specifically, each data of the data string is placed in the order of a first frame, a third frame, a second frame, and a fourth frame.

For example, first data X1 is placed in the first frame, next data Y1 is placed in the second frame, further next data Y'1 is placed in the third frame, and following data X2 is placed in the fourth frame.

As a result, data (X1, Y2, Y'3, X5 . . . ) is placed in the first frame, data (Y1, Y'2, X4, Y5 . . . ) is placed in the second frame, data (Y'1, X3, Y4, Y'5, . . . ) is placed in the third frame, and data (X2, Y3, Y'4, X6, . . . ) is placed in the fourth frame, respectively.

In the first frame, an information bit is placed at 3n+first, and parity bits are placed at 3n+second and 3n+third, respectively. Moreover, in the second frame, an information bit is placed at 3n+third, and parity bits are placed at 3n+first and 3n+second, respectively. Then, in the third frame, an information bit is placed at 3n+second, and parity bits are placed at 3n+first and 3n+third, respectively. Similarly, in the fourth frame, an information bit is placed at 3n+first, and parity bits are placed at 3n+second and 3n+third, respectively.

Then, among the data to be placed on each frame, the puncturing section 103 omits the judgment processing on whether puncturing is to be performed to the information bit, and performs the judgment processing on whether puncturing is to be performed to only the parity bits.

More specifically, the puncturing section 103 omits the judgment processing on whether puncturing is to be performed to 3n+first data, and performs the judgment processing on whether puncturing is to be performed to only 3n+second and 3n+third data.

Similarly, among the data inputed to the puncturing section 104, the puncturing section 105, and the puncturing section 106, each section omit the judgment processing on whether puncturing is to be performed to the information bit, and perform the judgment processing on whether puncturing is to be performed to only the parity bits.

More specifically, the puncturing section 104 omits the judgment processing on whether puncturing is to be performed to 3n+third data, and performs the judgment processing on whether puncturing is to be performed only for 3n+first and 3n+second data. Moreover, the puncturing section 105 omits the judgment processing on whether puncturing is to be performed to 3n+second data, and performs the judgment processing on whether puncturing is to be performed only for 3n+first and 3n+third data. The puncturing section 106 performs the same operation as that of the puncturing section 103.

Figure 3:
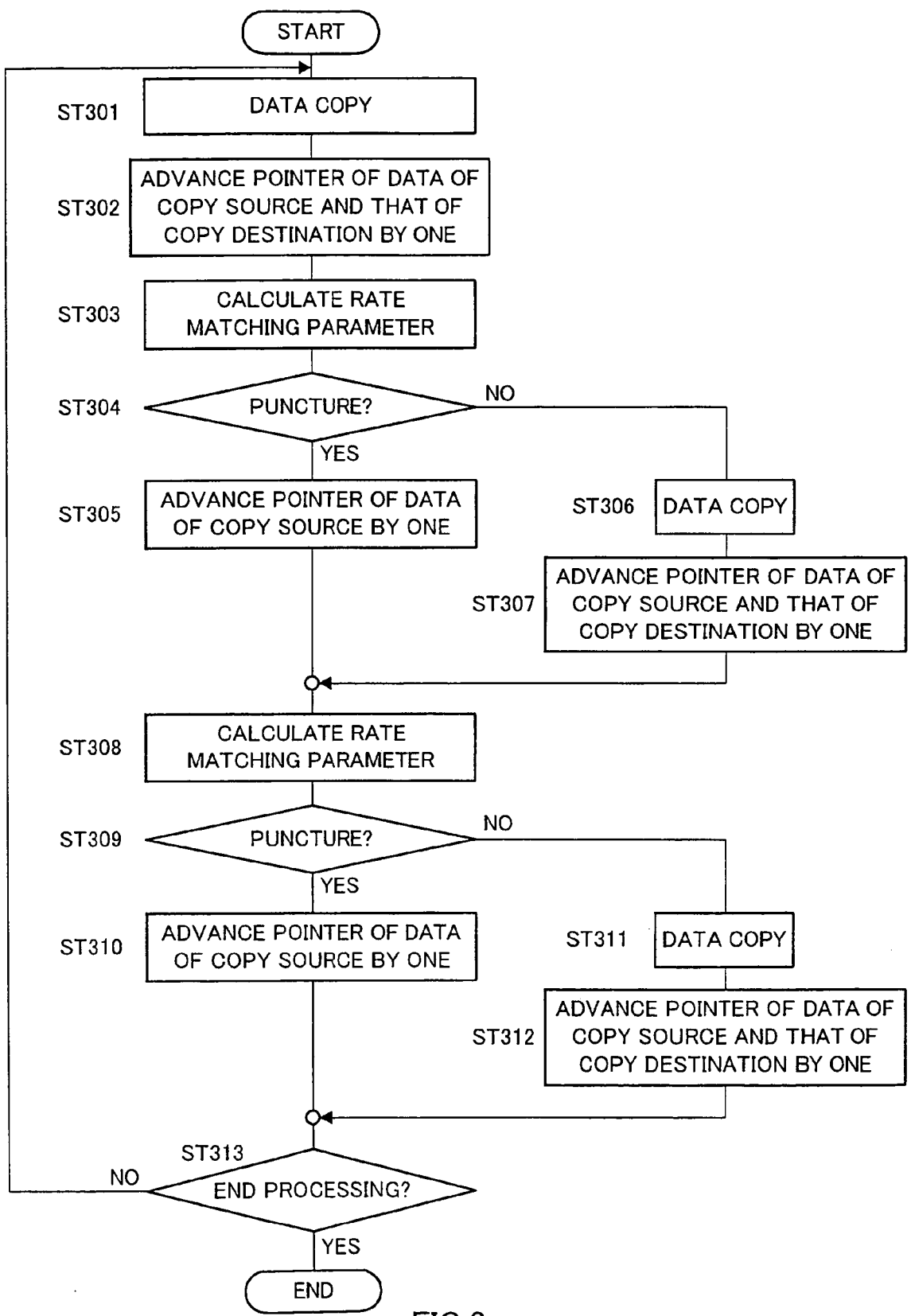
FIG. 3 is a flowchart illustrating an example of an operation of a puncturing section.

The following will explain an operation of each puncturing section. FIG. 3 is a flowchart illustrating an example of an operation of the puncturing section 103. The puncturing section 103 omits the judgment processing on whether puncturing is to be performed to 3n+first data, and performs the judgment processing on whether puncturing is to be performed to only 3n+second and 3n+third data.

In ST301, the puncturing section 103 performs one data copy from data before rate matching. In ST302, the puncturing section 103 advances a pointer of referring data and a pointer of an output destination by one. In ST303, the puncturing section 103 receives a rate matching parameter on data to be next processed from the puncturing instructing section 102.

In ST304, it is judged whether data to be next processed is data to be punctured (hereinafter referred to as "puncture data") based on the rate matching parameter. When data to be next processed is puncture data to be punctured, the processing flow proceeds to ST305, and when data to be next processed is not puncture data to be punctured, the processing flow proceeds to ST306. In ST305, the puncturing section 103 advances a pointer of referring data and a pointer of an output destination by one.

In ST306, the puncturing section 103 performs one data copy from data before rate matching. In ST307, the puncturing section 103 advances a pointer of referring data and a pointer of an output destination by one. In ST308, the puncturing section 103 receives a rate matching parameter on data to be next processed from the puncturing instructing section 102.

In ST309, it is judged whether data to be next processed is a puncture data based on the rate matching parameter. When data to be next processed is the data to be punctured, the processing flow proceeds to ST310, and when data to be next processed is not the data to be punctured, the processing flow proceeds to ST311. In ST310, the puncturing section 103 advances a pointer of referring data and a pointer of an output destination by one.

In ST311, the puncturing section 103 performs one data copy from data before rate matching. In ST312, the puncturing section 103 advances a pointer of referring data and a pointer of an output destination by one.

In ST313, the puncturing section 103 judges whether all data is rate matched, and when all data is rate matched, finishes the process, and when all data is not rate matched, the processing flow goes back to ST301.

Figure 4:
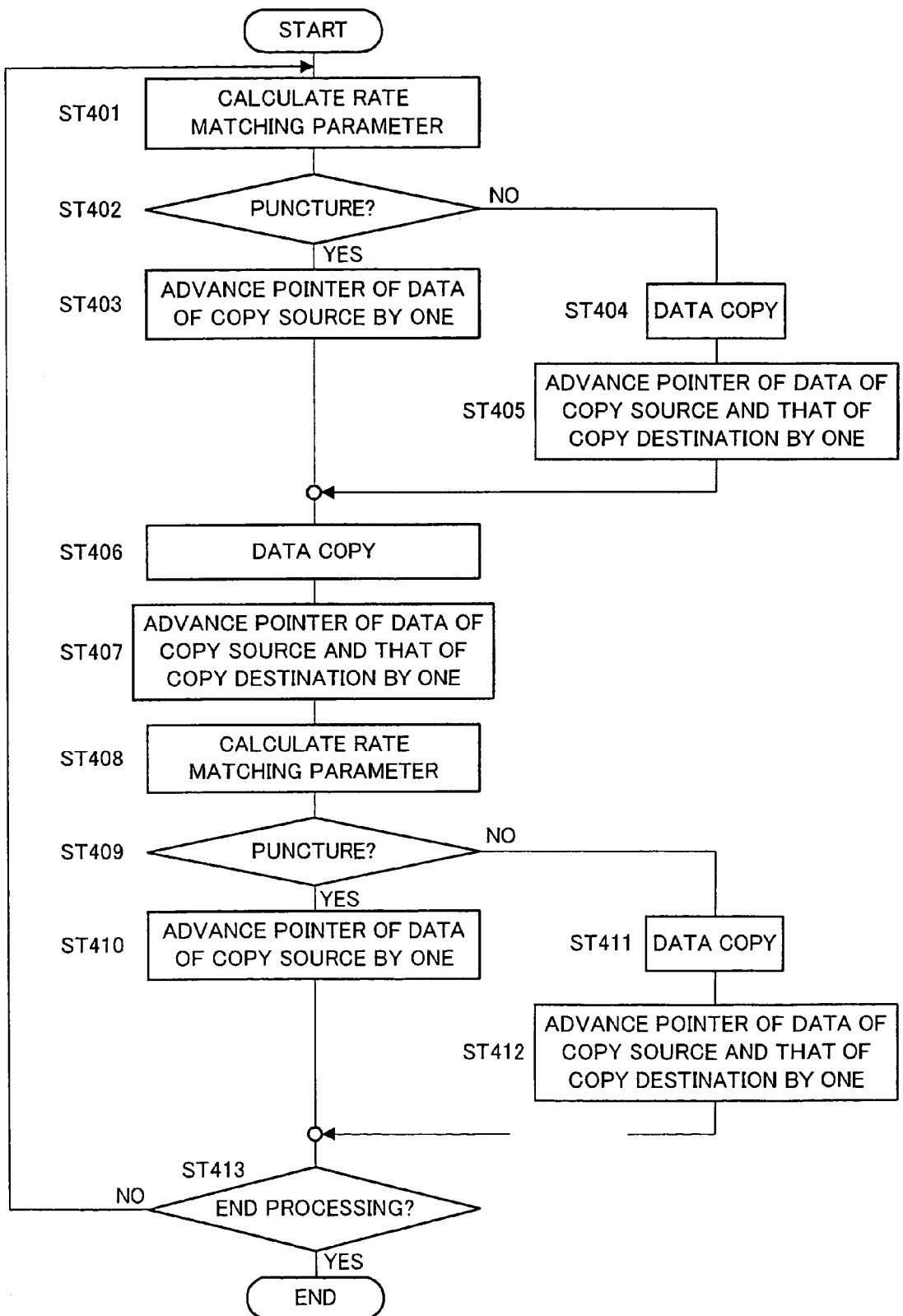
FIG. 4 is a flowchart illustrating an example of an operation of a puncturing section.

FIG. 4 is a flowchart illustrating an example of an operation of the puncturing section 104. The puncturing section 104 omits the judgment processing on whether puncturing is to be performed to 3n+second data of the data string and then performs the judgment processing on whether puncturing is to be performed only for 3n+first and 3n+third data.

In ST401, the puncturing section 104 receives a rate matching parameter on data to be next processed from the puncturing instructing section 102.

In ST402, it is judged whether data to be next processed is puncture data based on the rate matching parameter. When data to be next processed is the data to be punctured, the processing flow proceeds to ST403, and when data to be next processed is not the data to be punctured, the processing flow proceeds to ST404. In ST403, the puncturing section 104 advances a pointer of referring data and a pointer of an output destination by one.

In ST404, the puncturing section 104 performs one data copy from data before rate matching. In ST405, the puncturing section 104 advances a pointer of referring data and a pointer of an output destination by one.

In ST406, the puncturing section 104 performs one data copy from data before rate matching. In ST407, the puncturing section 104 advances a pointer of referring data and a pointer of an output destination by one.

In ST408, the puncturing section 104 receives a rate matching parameter on data to be next processed from the puncturing instructing section 102.

In ST409, it is judged whether data to be next processed is puncture data based on the rate matching parameter. When data to be next processed is the data to be punctured, the processing flow proceeds to ST410, and when data to be next processed is not the data to be punctured, the processing flow proceeds to ST411. In ST410, the puncturing section 104 advances a pointer of referring data and a pointer of an output destination by one.

In ST411, the puncturing section 104 performs one data copy from data before rate matching. In ST412, the puncturing section 104 advances a pointer of referring data and a pointer of an output destination by one.

In ST413, the puncturing section 104 judges whether all data is rate matched, and when all data is rate matched, finishes the process, and when all data is not rate matched, the processing flow goes back to ST401.

Figure 5:
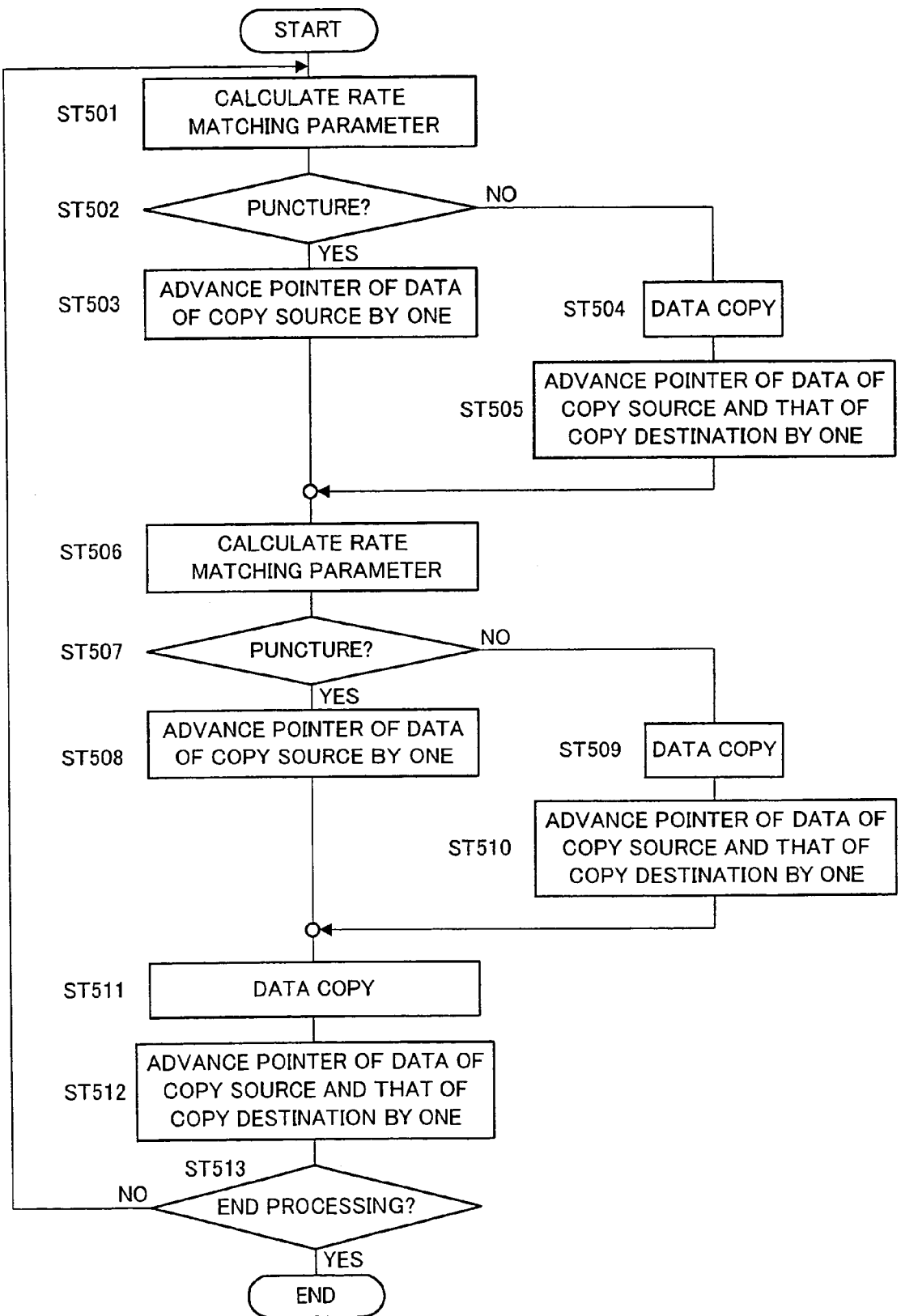
FIG. 5 is a flowchart illustrating an example of an operation of a puncturing section.

FIG. 5 is a flowchart illustrating an example of an operation of the puncturing section 105.

The puncturing section 105 omits the judgment processing on whether puncturing is to be performed to 3n+second data of the data string and then performs the judgment processing on whether puncturing is to be performed only for 3n+first and 3n+third data.

In ST501, the puncturing section 105 receives a rate matching parameter on data to be next processed from the puncturing instructing section 102.

In ST502, it is judged whether data to be next processed is the data based on the rate matching parameter. When data to be next processed is the data to be punctured, the processing flow proceeds to ST503, and when data to be next processed is not the data to be punctured, the processing flow proceeds to ST504. In ST503, the puncturing section 105 advances a pointer of referring data and a pointer of an output destination by one.

In ST504, the puncturing section 105 performs one data copy from data before rate matching. In ST505, the puncturing section 105 advances a pointer of referring data and a pointer of an output destination by one.

In ST506, the puncturing section 105 receives a rate matching parameter on data to be next processed from the puncturing instructing section 102.

In ST507, it is judged whether data to be next processed is puncture data based on the rate matching parameter. When data to be next processed is the data to be punctured, the processing flow proceeds to ST508, and when data to be next processed is not the data to be punctured, the processing flow proceeds to ST509. In ST508, the puncturing section 105 advances a pointer of referring data and a pointer of an output destination by one.

In ST509, the puncturing section 105 performs one data copy from data before rate matching. In ST510, the puncturing section 105 advances a pointer of referring data and a pointer of an output destination by one.

In ST511, the puncturing section 105 performs one data copy from data before rate matching. In ST512, the puncturing section 105 advances a pointer of referring data and a pointer of an output destination by one.

In ST513, the puncturing section 105 judges whether all data is rate matched, and when all data is rate matched, finishes the process, and when all data is not rate matched, the processing flow goes back to ST501.

In this way, regarding the data strings arranged in the plurality of frames by interleave processing, the rate matching apparatus of this embodiment enables to perform the puncturing only for the parity bit without distinguishing of the information bit and the parity bit, and to implement light-load rate matching.

Additionally, when the regularities of the arrangements of the information bits and the parity bits in the frames placed by interleave processing are the same, a block where the judgment and puncturing are performed can be shared since it is judged whether puncturing is to be performed to a bit that is placed at the same position of the data string. For example, regarding data in the first frame and the fourth frame in the data string of FIG. 2, the information bit is placed at 3n+first and the parity bits are placed at 3n+second and 3n+third in both cases.

Accordingly, the data distributor 101 outputs the data strings in the first frame and the fourth frame to the puncturing section 103, thus enabling to omit the puncturing section 106 from the configuration of the rate matching apparatus.

Moreover, in the rate matching apparatus of this embodiment, the coding rate and the number of frames where data is arranged are not limited. In the rate matching apparatus of this embodiment, data is placed in a plurality of frames at the time of coding and interleave processing, with the result that the data strings are distinguished for each frame to perform puncturing according to the number of patterns of the arrangement of the information bits and the parity bits.

For example, when a TTI is 20 ms and a frame length is 10 ms, the TTI is twice as large as the frame length and transmission processing is performed in unit of two frames.

FIG. 6 is a view illustrating one example of turbo-coded data strings. In FIG. 6, it is assumed that a frame where data is first placed is referred to a first frame and that a frame where data is second placed is referred to a second frame.

In the first frame, an information bit is placed at 3n+first and party bits are placed at 3n+second and 3n+third, respectively. Then, the judgment processing on whether puncturing is to be performed to only 3n+second and 3n+third data in the data string in the first frame is executed and then puncturing is performed. Here, n is an integer of 0 or more.

Moreover, in the second frame, an information bit is placed at 3n+second and party bits are placed at 3n+first and 3n+third, respectively. Then, the judgment processing on whether puncturing is to be performed to only 3n+first and 3n+third data in the data string in the second frame is executed and then puncturing is performed.

Furthermore, as another example, when a TTI is 80 ms and a frame length is 10 ms, the TTI is eight times as large as the frame length and transmission processing is performed in unit of eight frames.

FIG. 7 is a view illustrating one example of turbo-coded data strings. In FIG. 7, it is assumed that a frame where data is first placed is referred to a first frame and that a frame where data is second placed is referred to a second frame. Similarly, it is assumed that frames where data is third to eighth placed are referred to third to eighth frames, respectively.

In the first frame, the fourth frame and the seventh frame, an information bit is placed at 3n+first and party bits are placed at 3n+second and 3n+third, respectively. Then, the judgment processing on whether puncturing is to be performed to only 3n+second and 3n+third data in the data string in each of the first frame, the fourth frame and the seventh frame is executed and then puncturing is performed. Here, n is an integer of 0 or more.

Moreover, in the second frame, the fifth frame, and the eighth frame, an information bit is placed at 3n+second and party bits are placed at 3n+first and 3n+third, respectively. Then, the judgment processing on whether puncturing is to be performed to only 3n+first and 3n+third data in the data string in each of the second frame, the fifth frame and the eighth frame is executed and then puncturing is performed.

Then, in the third frame and the sixth frame, an information bit is placed at 3n+third and party bits are placed at 3n+first and 3n+second, respectively. Then, the judgment processing on whether puncturing is to be performed to only 3n+first and 3n+second data in the data string in each of the third frame and the sixth frame is executed and then puncturing is performed.

In this way, the data strings are distinguished for each frame to perform puncturing according to the number of patterns of the arrangement of the information bits and the parity bits, thereby making it possible to perform puncturing even when the data strings are interleaved in an arbitrary number of frames at the transmitting side.

(Embodiment 2)

In the data string punctured at a transmitting side, the part of parity bits is interleaved and the order of the information bits and the parity bits becomes irregular. By filling for reduced parity bits in the data string (thereinafter referred to as depuncturing), the order of the information bits and the parity bits is set in the data string according to a predetermined rule.

Accordingly, in the case of the information bit, the rate matching apparatus copies received data as it is, when the parity bit is not reduced, the rate matching apparatus also copies received data as it is, and when the parity bit is reduced, the rate matching apparatus fills new data.

Figure 8:
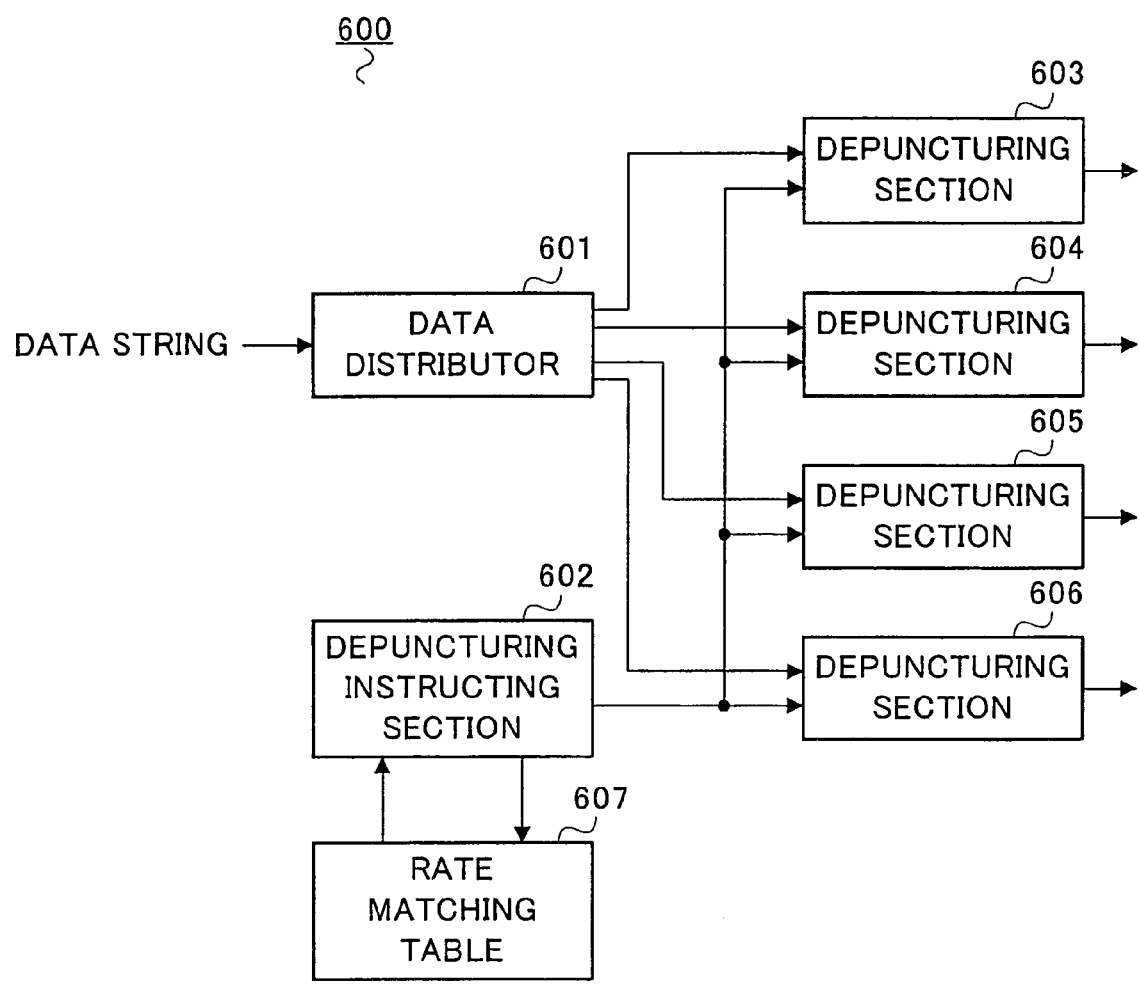
FIG. 8 is a block diagram illustrating a configuration of a rate matching apparatus according to Embodiment 2 of the present invention.

FIG. 8 is a block diagram illustrating a configuration of a rate matching apparatus according to Embodiment 2 of the present invention. This embodiment will explain an example in which a TTI is 40 ms, and a frame length is 10 ms. The rate matching apparatus depunctures data extracted from a received signal for each frame.

In the following, at a transmitting side, a frame where data is first placed is referred to a first frame, a frame where data is second placed is referred to a second frame, a frame where data is third placed is referred to a third frame, and a frame where data is fourth placed is referred to a fourth frame.

In FIG. 8, a rate matching apparatus 600 mainly includes a data distributor 601, a depuncturing instructing section 602, depuncturing sections 603 to 606, and a rate matching table 607.

The data distributor 601 distributes data strings extracted from a received signal in a frame unit and outputs them to the depuncturing sections 603 to 606. Additionally, the details on the data string distributing method by the data distributor 601 will be described later.

More specifically, among data strings extracted from the received signal, the data distributor 601 outputs data of the first frame to the depuncturing section 603, data of the second frame to the depuncturing section 604, data of the third frame to the depuncturing section 605, and data of the fourth frame to the depuncturing section 606.

The depuncturing instructing section 602 refers to a rate matching table 607 to output information on data to be punctured to the depuncturing section 603, the depuncturing section 604, the depuncturing section 605, and the depuncturing section 606.

The depuncturing section 603 performs the judgment processing on whether depuncturing is to be performed only for 3n+second and 3n+third data in the data string of the first frame to be restored and then performs depuncturing. Here, n is an integer of 0 or more.

The depuncturing section 604 performs the judgment processing on whether depuncturing is to be performed only for 3n+first and 3n+second data in the data string of the second frame to be restored and then performs depuncturing.

The depuncturing section 605 performs the judgment processing on whether depuncturing is to be performed to only 3n+first and 3n+third data in the data string of the third frame to be restored and then performs depuncturing.

The depuncturing section 606 performs the judgment processing on whether depuncturing is to be performed only for 3n+second and 3n+third data in the data string of the fourth frame to be restored and then performs depuncturing. The rate matching data table 607 stores the information on data to be depunctured.

In the depunctured first frame, an information bit is placed at 3n+first, and parity bits are placed at 3n+second and 3n+third, respectively. Moreover, in the depunctured second frame, an information bit is placed at 3n+third, and parity bits are placed at 3n+first and 3n+second, respectively. Then, in the depunctured third frame, an information bit is placed at 3n+second, and parity bits are placed at 3n+first and 3n+third, respectively. Similarly, in the depunctured fourth frame, an information bit is placed at 3n+first, and parity bits are placed at 3n+second and 3n+third, respectively.

Then, among data strings to be restored by depuncturing, the depuncturing section 603 omits the judgment processing on whether depuncturing is to be performed to data forming the information bit, and performs the judgment processing on whether depuncturing is to be performed only for data forming the parity bits.

More specifically, the depuncturing section 603 omits the judgment processing on whether depuncturing is to be performed to 3n+first data in the data string to be restored and then performs the judgment processing on whether depuncturing is to be performed only for 3n+second and 3n+third data.

Similarly, among data to be restored, the depuncturing section 604, the depuncturing section 605 and the depuncturing section 606 omit the judgment processing on whether depuncturing is to be performed to an information bit, and performs the judgment processing on whether depuncturing is to be performed only for the parity bits, namely, judges whether data is one that is punctured at the transmitting side.

More specifically, the depuncturing section 604 omits the judgment processing on whether depuncturing is to be performed to 3n+third data in the data string to be restored and then performs the judgment processing on whether depuncturing is to be performed to only 3n+first and 3n+second data.

Moreover, the depuncturing section 605 omits the judgment processing on whether depuncturing is to be performed to 3n+second data, and performs the judgment processing on whether depuncturing is to be performed only for 3n+first and 3n+third data. The depuncturing section 606 performs the same operation as that of the depuncturing section 603.

Figure 9:
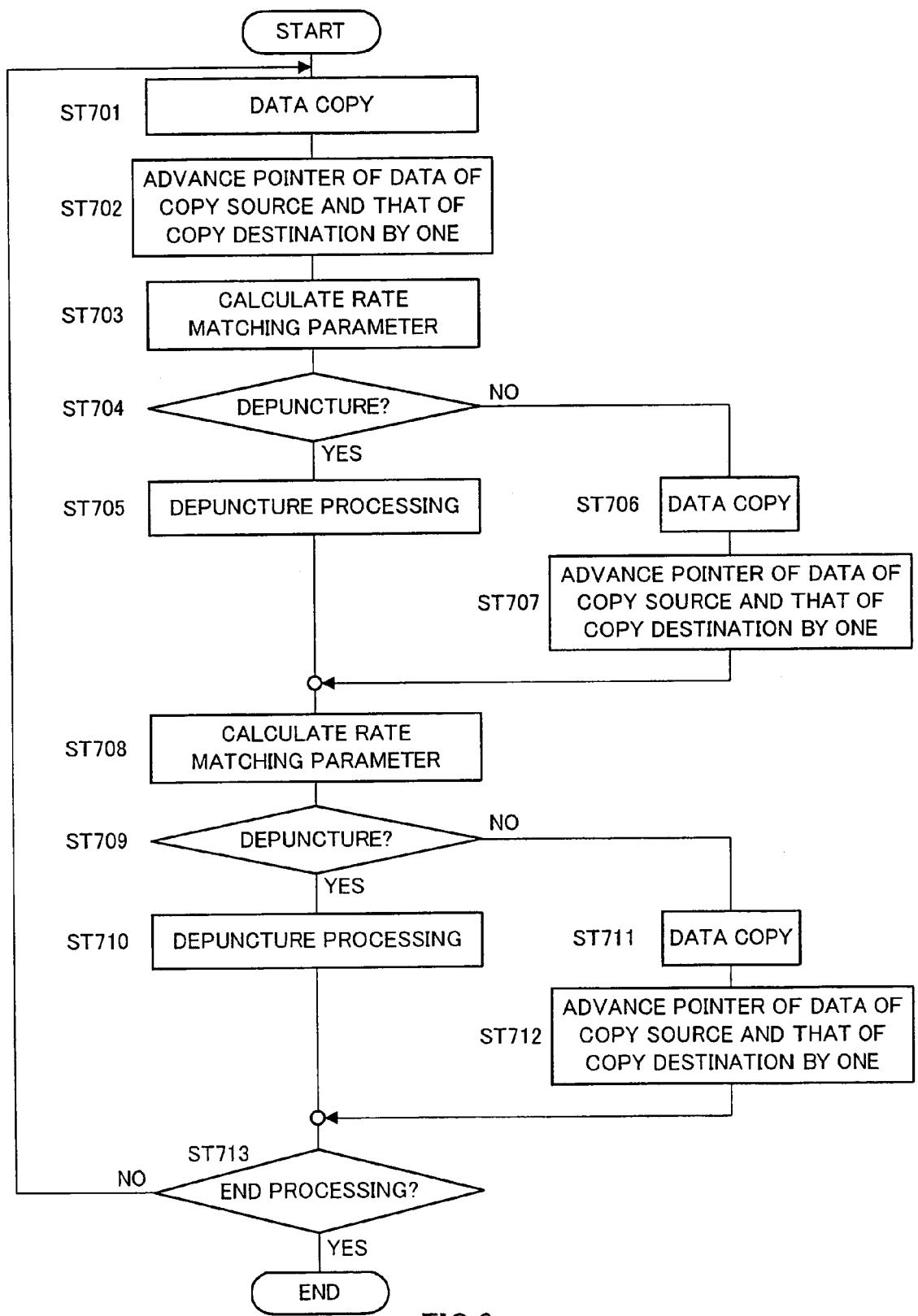
FIG. 9 is a flowchart illustrating an example of an operation of a depuncturing section.

The following will explain an operation of each depuncturing section. FIG. 9 is a flowchart illustrating an example of an operation of the depuncturing section 603. The depuncturing section 603 omits the judgment processing on whether depuncturing is to be performed to 3n+first data in the data string to be restored and then performs the judgment processing on whether depuncturing is to be performed only for 3n+second and 3n+third data.

In ST701, the depuncturing section 603 performs one data copy from data just before puncturing. In ST702, the depuncturing section 603 advances a pointer of referring data and a pointer of an output destination by one.

In ST703, the depuncturing section 603 receives a rate matching parameter on data to be next processed from the depuncturing instructing section 602.

In ST704, it is judged whether data to be next processed is data to be depunctured (hereinafter referred to as "depuncture data") based on the rate matching parameter. When data to be next processed is the data to be depunctured, the processing flow proceeds to ST705, and when data to be next processed is not the data to be punctured, the processing flow proceeds to ST706.

In ST705, the depuncturing section 603 performs depuncturing to compensate for parity bits.

In ST706, the depuncturing section 603 performs one data copy from received data. In ST707, the depuncturing section 603 advances a pointer of referring data and a pointer of an output destination by one.

In ST708, the depuncturing section 603 receives a rate matching parameter on data to be next processed from the depuncturing instructing section 602.

In ST709, it is judged whether data to be next processed is the depunctured data based on the rate matching parameter. When data to be next processed is the data to be depunctured, the processing flow proceeds to ST710, and when data to be next processed is not the data to be punctured, the processing flow proceeds to ST711.

In ST710, the depuncturing section 603 performs depuncturing to fill for punctured parity bits.

In ST711, the depuncturing section 603 performs one data copy from received data. In ST712, the depuncturing section 603 advances a pointer of referring data and a pointer of an output destination by one.

In ST713, the depuncturing section 603 judges whether all data is rate matched, and when all data is rate matched, finishes the process, and when all data is not rate matched, the processing flow goes back to ST701.

Figure 10:
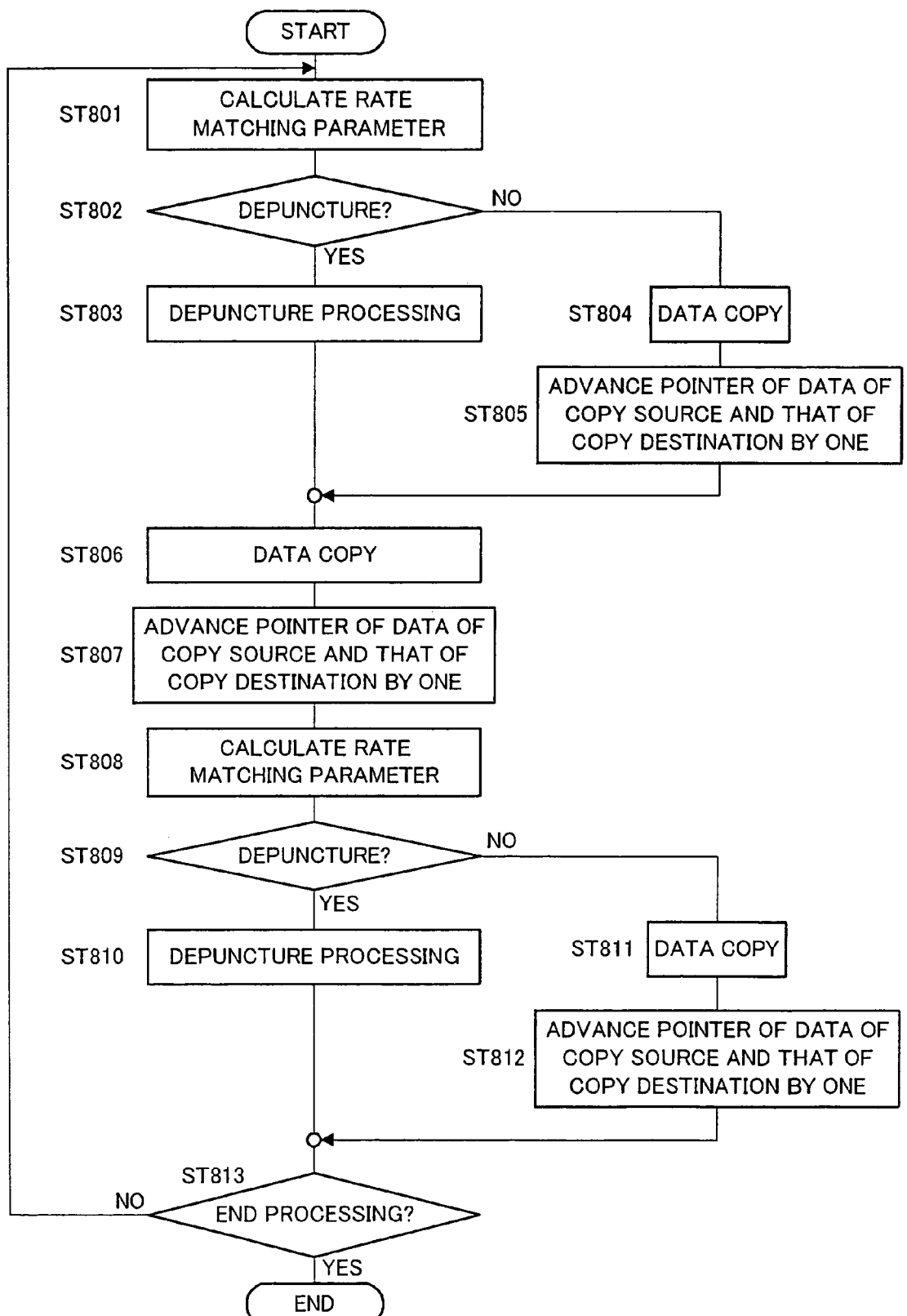
FIG. 10 is a flowchart illustrating an example of an operation of a depuncturing section.

FIG. 10 is a flowchart illustrating an example of an operation of the depuncturing section 604. The depuncturing section 604 omits the judgment processing on whether depuncturing is to be performed to 3n+third data of the data string and then performs the judgment processing on whether depuncturing is to be performed only for 3n+first and 3n+second data.

In step ST801, the depuncturing section 604 receives a rate matching parameter on data to be next processed from the depuncturing instructing section 602.

In ST802, it is judged whether data to be next processed is the depunctured data based on the rate matching parameter. When data to be next processed is the data to be depunctured, the processing flow proceeds to ST803, and when data to be next processed is not the data to be depunctured, the processing flow proceeds to ST804.

In ST803, the depuncturing section 604 performs depuncturing to fill for punctured parity bits.

In ST804, the depuncturing section 604 performs one data copy from received data. In ST805, the depuncturing section 604 advances a pointer of referring data and a pointer of an output destination by one.

In step ST806, the depuncturing section 604 performs one data copy from received data. In ST807, the depuncturing section 604 advances a pointer of referring data and a pointer of an output destination by one.

In step ST808, the depuncturing section 604 receives a rate matching parameter on data to be next processed from the depuncturing instructing section 602.

In ST809, it is judged whether data to be next processed is the depunctured data based on the rate matching parameter. When data to be next processed is the data to be depunctured, the processing flow proceeds to ST810, and when data to be next processed is not depuncture data to be depunctured, the processing flow proceeds to ST811.

In ST810, the depuncturing section 604 performs depuncturing to fill for punctured parity bits.

In ST811, the depuncturing section 604 performs one data copy from received data. In ST812, the depuncturing section 604 advances a pointer of referring data and a pointer of an output destination by one.

In ST813, the depuncturing section 604 judges whether all data is rate matched, and when all data is rate matched, finishes the process, and when all data is not rate matched, the processing flow goes back to ST801.

Figure 11:
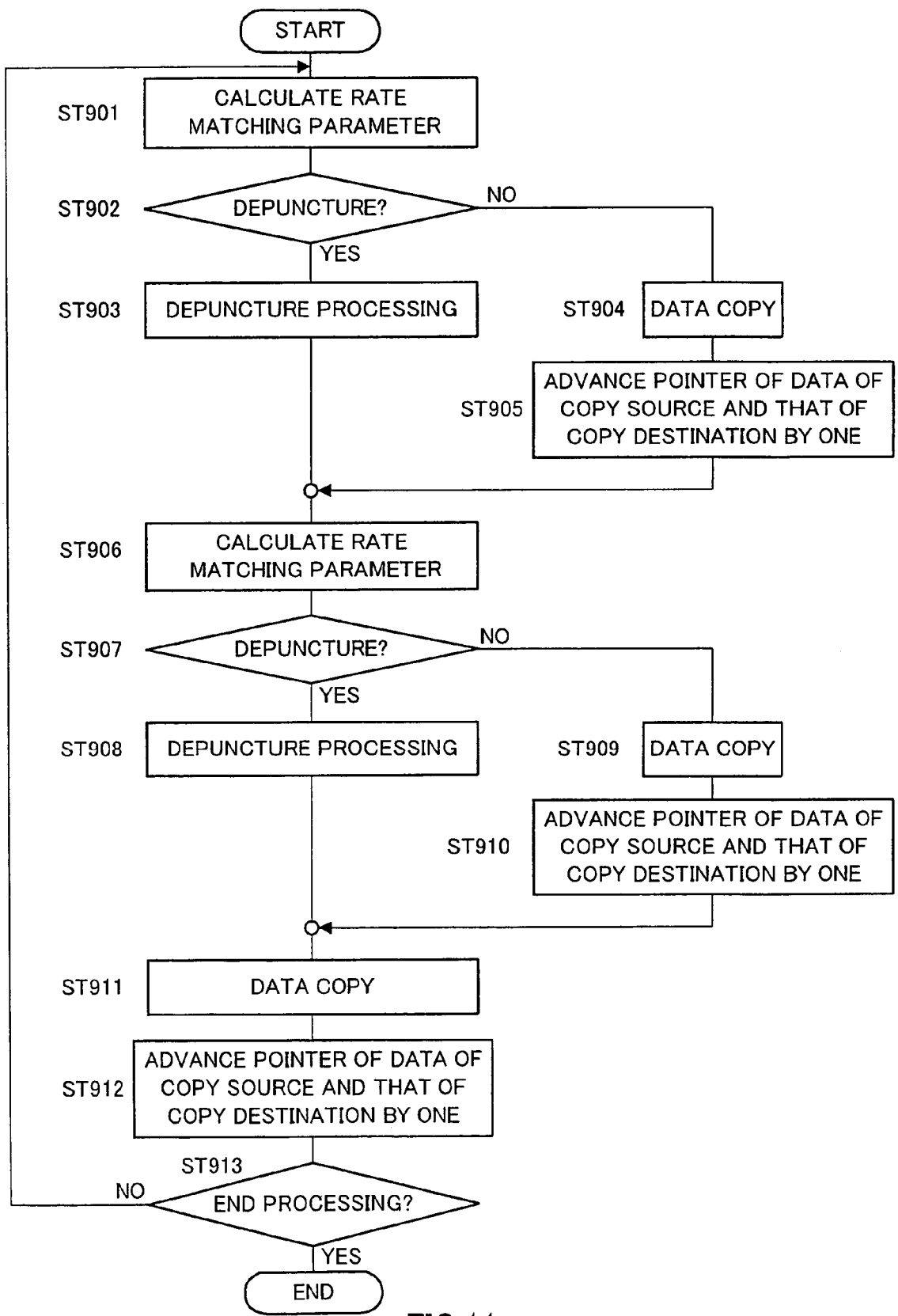
FIG. 11 is a flowchart illustrating an example of an operation of a depuncturing section.

FIG. 11 is a flowchart illustrating an example of an operation of the depuncturing section 605. The depuncturing section 605 omits the judgment processing on whether depuncturing is to be performed to 3n+second data of the data string to be restored and then performs the judgment processing on whether depuncturing is to be performed only for 3n+first and 3n+third data.

In step ST901, the depuncturing section 605 receives a rate matching parameter on data to be next processed from the depuncturing instructing section 602.

In ST902, it is judged whether data to be next processed is the depunctured data based on the rate matching parameter. When data to be next processed is the data to be depunctured, the processing flow proceeds to ST903, and when data to be next processed is not the data to be punctured, the processing flow proceeds to ST904.

In ST903, the depuncturing section 605 performs depuncturing to compensate for parity bits.

In ST904, the depuncturing section 605 performs one data copy from received data. In ST905, the depuncturing section 605 advances a pointer of referring data and a pointer of an output destination by one.

In step ST906, the depuncturing section 605 receives a rate matching parameter on data to be next processed from the depuncturing instructing section 602.

In ST907, it is judged whether data to be next processed is the depunctured data based on the rate matching parameter. When data to be next processed is the data to be depunctured, the processing flow proceeds to ST908, and when data to be next processed is not the data to be depunctured, the processing flow proceeds to ST909.

In ST908, the depuncturing section 605 performs depuncturing to compensate for parity bits.

In ST909, the depuncturing section 605 performs one data copy from received data. In ST910, the depuncturing section 605 advances a pointer of referring data and a pointer of an output destination by one.

In ST911, the depuncturing section 605 performs one data copy from received data. In ST912, the depuncturing section 605 advances a pointer of referring data and a pointer of an output destination by one.

In ST913, the depuncturing section 605 judges whether all data is rate matched, and when all data is rate matched, finishes the process, and when all data is not rate matched, the processing flow goes back to ST901.

In this way, regarding the data strings arranged in the plurality of frames by interleave processing, the rate matching apparatus of this embodiment enables to perform the depuncturing only for the parity bit without distinguishing of the information bit and the parity bit, and to implement light-load rate matching.

Additionally, when the regularities of the arrangements of the information bits and the parity bits in the frames placed by interleave processing are the same at the transmitting side, a block where the judgment and the depuncturing are performed can be shared since it is judged whether depuncturing is to be performed to a bit placed at the same position of the data string. For example, regarding data in the first frame and the fourth frame in the data string of FIG. 1, the information bit is placed at 3n+first and the parity bits are placed at 3n+second and 3n+third in both cases.

Accordingly, the data distributor 601 outputs the data strings in the first frame and the fourth frame to the depuncturing section 603, thus enabling to omit the depuncturing section 606 from the configuration of the rate matching apparatus.

Moreover, in the rate matching apparatus of this embodiment, the coding rate and the number of frames where data is arranged are not limited. In the rate matching apparatus of this embodiment, data is placed in a plurality of frames at the time of coding and interleave processing, with the result that the data strings are distinguished for each frame to perform depuncturing according to the number of patterns of the arrangement of the information bits and the parity bits.

For example, when a TTI is 20 ms and a frame length is 10 ms, the TTI is twice as large as the frame length and transmission processing is performed in section of two frames.

FIG. 12 is a view illustrating one example of turbo-coded data strings. In FIG. 12, it is assumed that a frame where data is first placed is referred to a first frame and that a frame where data is second placed is referred to a second frame.

In the first frame, an information bit is placed at 3n+first and party bits are placed at 3n+second and 3n+third, respectively. Then, the judgment processing on whether depuncturing is to be performed only for 3n+second and 3n+third data in the data string in the first frame and then puncturing is performed. Here, n is an integer of 0 or more.

Moreover, in the second frame, an information bit is placed at 3n+second and party bits are placed at 3n+first and 3n+third, respectively. Then, the judgment processing on whether depuncturing is to be performed only for 3n+first and 3n+third data in the data string in the second frame and then puncturing is performed.

Furthermore, as another example, when a TTI is 80 ms and a frame length is 10 ms, the TTI is eight times as large as the frame length and transmission processing is performed in unit of eight frames.

FIG. 13 is a view illustrating one example of turbo-coded data strings. In FIG. 13, it is assumed that a frame where data is first placed is referred to a first frame and that a frame where data is second placed is referred to a second frame. Similarly, it is assumed that frames where data is third to eighth placed are referred to third to eighth frames, respectively.

In the first frame, the fourth frame, and the seventh frame, an information bit is placed at 3n+first and party bits are placed at 3n+second and 3n+third, respectively. Then, the judgment processing on whether depuncturing is to be performed to only 3n+second and 3n+third data in the data strings in the first frame, the fourth frame and the seventh frame and then depuncturing is performed. Here, n is an integer of 0 or more.

Moreover, in the second frame, the fifth frame, and the eighth frame, an information bit is placed at 3n+second and party bits are placed at 3n+first and 3n+third, respectively. Then, the judgment processing on whether depuncturing is to be performed only for 3n+first and 3n+third data in the data strings in the second frame, the fifth frame and the eighth frame and then depuncturing is performed.

Then, in the third frame and the sixth frame, an information bit is placed at 3n+third and party bits are placed at 3n+first and 3n+second, respectively. Then, the judgment processing on whether depuncturing is to be performed only for 3n+first and 3n+second data in the data strings in the third frame and the sixth frame and then depuncturing is performed.

In this way, the data strings are distinguished for each frame to perform depuncturing according to the number of patterns of the arrangement of the information bits and the parity bits, thereby making it possible to perform depuncturing even when the data strings are interleaved in an arbitrary number of frames at the transmitting side.

As explained above, according to the rate matching apparatus and rate matching method of the present invention, interleaved data strings are divided in a frame unit, an arrangement of information bits is measured in each frame from the order of information bits and parity bits, and puncturing is performed only for the parity bits without performing a computation for making a distinction between the information bit and the parity bit, thus enabling to reduce processing necessary for turbo-coded data after interleave processing and to perform light-load rate matching.

Moreover, according to the rate matching apparatus and rate matching method of the present invention, when punctured data is received, an arrangement of information bits is measured in each frame from the order of information bits and parity bits, and depuncturing is performed only for the data location where the parity bits are to be placed without performing a computation for making a distinction between the information bit and the parity bit, thus enabling to reduce processing necessary for data sent after being turbo-coded, interleaved and punctured data and to perform light-load rate matching.

This application is based on the Japanese Patent Application No. 2002-021499 filed on Jan. 30, 2002, entire content of which is expressly incorporated by reference herein.

INDUSTRIAL APPLICABILITY

The present invention is suitable for use in a rate matching apparatus and rate matching method that performs puncturing or depuncturing to a turbo code.

The invention claimed is:

1. A rate matching apparatus comprising:
   a distributing section that sequentially distributes data from a serial data string to a plurality of frames in parallel data strings; and
   a puncturing section that performs puncturing on data in the frames according to a rule of an arrangement of the data in the frames formed based on an order the serial data string is distributed to the frames.

2. The rate matching apparatus according to claim 1, wherein:
   the puncturing section performs puncturing only for parity bits, and
   the arrangement rule is a rule of arrangement of information bits and parity bits of turbo-coded data in the frames.

3. The rate matching apparatus according to claim 1, wherein:
   the puncturing section performs puncturing only for parity bits, and
   the arrangement rule is a rule of arrangement of information bits and parity bits determined from a frame number without performing a computation for making a distinction between the information bits and the parity bits.

4. A rate matching apparatus comprising:
   a distributing section that sequentially distributes data from a punctured serial data string to a plurality of frames in parallel data strings; and
   a depuncturing section that performs depuncturing on the frames according to a rule of an arrangement of the data in the frames formed based on an order the serial data string is distributed to the frames.

5. The rate matching apparatus according to claim 4, wherein:
   the depuncturing section performs depuncturing to restore only punctured parity bits, and
   the arrangement rule is a rule of an arrangement of information bits and parity bits of turbo-coded data in the frames.

6. The rate matching apparatus according to claim 4, wherein:
   the depuncturing section performs depuncturing only for punctured parity bits, and
   the arrangement rule is a rule of the arrangement of information bits and parity bits determined from a frame number.

7. A communication terminal apparatus comprising:
   a distributing section that sequentially distributes data from a serial data string to a plurality of frames in parallel data strings; and
   a puncturing section that performs puncturing on data of the frames according to a rule of an arrangement of the data in the frames formed based on an order the serial data string is distributed to the frames.

8. A base station apparatus comprising:
   a distribution section that sequentially distributes data from a serial data string to a plurality of frames in parallel data strings; and
   a puncturing section that performs puncturing on data of the frames according to a rule of an arrangement of the data in the frames formed based on an order the serial data string is distributed to the frames.

9. A rate matching method comprising:
   distributing data from a serial data string sequentially to a plurality of frames in parallel data strings; and
   performing puncturing on the data of the frames according to a rule of an arrangement of the data in the frames formed based on an order the serial data string is distributed to the frames.

10. A rate matching method comprising:
    distributing sequentially data from a punctured serial data string to a plurality of frames in parallel data strings; and
    performing depuncturing on the frames according to a rule of an arrangement of the data in the frames formed based on an order the serial data string is distributed to the frames.

* * * * *